(12) United States Patent
Cavazza

(10) Patent No.: US 6,684,889 B2
(45) Date of Patent: Feb. 3, 2004

(54) METHOD AND DEVICE FOR TREATING A SUBSTRATE

(75) Inventor: Gilbert Cavazza, Viuz en Sallaz (FR)

(73) Assignee: Karl Suss France, St. Jeoire en Faucigny (FR)

( * ) Notice: Subject to any disclaimer, the term of this patent is extended or adjusted under 35 U.S.C. 154(b) by 56 days.

(21) Appl. No.: 09/980,124

(22) PCT Filed: Apr. 19, 2001

(86) PCT No.: PCT/FR01/01204

§ 371 (c)(1),
(2), (4) Date: Nov. 30, 2001

(87) PCT Pub. No.: WO01/82340

PCT Pub. Date: Nov. 1, 2001

(65) Prior Publication Data

US 2002/0162570 A1 Nov. 7, 2002

(30) Foreign Application Priority Data

Apr. 20, 2000 (FR) .............................................. 00 05087

(51) Int. Cl.[7] .................................................. B08B 7/04
(52) U.S. Cl. ............................ 134/1.3; 134/33; 134/34; 134/36; 134/148; 134/135; 134/153; 134/184; 134/902
(58) Field of Search ............................ 134/902, 1, 1.3, 134/2, 32, 33, 34, 36, 148, 153, 135; 15/77, 88.1, 88.2

(56) References Cited

U.S. PATENT DOCUMENTS

| 4,655,162 A | | 4/1987 | Kameyama |
| 5,858,112 A | | 1/1999 | Yonemizu et al. |
| 6,021,785 A | | 2/2000 | Grutzediek et al. |
| 6,164,133 A | * | 12/2000 | Watanabe ................... 73/432.1 |
| 6,276,378 B1 | * | 8/2001 | Taniyama et al. ........... 134/153 |
| 6,315,836 B1 | * | 11/2001 | Oka et al. ..................... 134/10 |
| 6,374,837 B2 | * | 4/2002 | Scranton et al. ............ 134/161 |
| 6,385,805 B2 | * | 5/2002 | Konishi et al. ................ 15/77 |
| 6,395,101 B1 | * | 5/2002 | Scranton et al. .............. 134/32 |
| 6,508,258 B1 | * | 1/2003 | Lorimer ................... 134/102.1 |

FOREIGN PATENT DOCUMENTS

EP           0893819 A2    1/1999

OTHER PUBLICATIONS

International Search Report dated Jun. 27, 2001.

* cited by examiner

Primary Examiner—Alexander Markoff
(74) Attorney, Agent, or Firm—Stevens, Davis, Miller & Mosher, LLP

(57) ABSTRACT

The invention concerns a method and a device for treating a substrate of an integrated circuit or the like during production. The invention is characterized in that it consists in spraying, from the bottom upwards, a treatment liquid (24) on the surface to be treated (20I), facing downwards, of said substrate (20) and transducers (8) apply ultrasonic waves to said substrate (20) via said spayed treatment liquid (24).

11 Claims, 2 Drawing Sheets

METHOD AND DEVICE FOR TREATING A SUBSTRATE

The present invention relates to a method and a device for treating the substrate of an integrated circuit or similar product during manufacture, the purpose of said treatment being at least to remove, using the action of at least one treatment liquid, unwanted particles borne by a face to be treated of said substrate.

Such unwanted particles may include dust or similar particles, or even portions of unhardened photosensitive resin following exposure of the substrate through a mask. Consequently, said treatment liquid may be a washing or rinsing liquid (for example water) or even a liquid for curing said resin.

Many methods and devices for such a treatment are already known. Among these known methods and devices, those described in document U.S. Pat. No. 4,655,162 propose holding said substrate, during said treatment, so that its surface to be treated is directed downward. This results in the advantage that said unwanted particles are easily removed, since they are subjected to the effects of gravity in addition to the dragging effect of said treatment liquid. In this earlier document, said treatment liquid is contained in a small dish, which is placed under said substrate, and into which the latter can be introduced.

The subject of the present invention is a method and a device of this type, in which the removal of said unwanted particles is further improved.

To this end, according to the invention, the method for treating the substrate of an integrated circuit or similar product during manufacture, the aim of said treatment being at least to remove, using the action of at least one treatment liquid, unwanted particles borne by a face to be treated of said substrate and said substrate being held, during said treatment, so that said face to be treated is directed downward, is noteworthy:

in that said treatment liquid is sprayed from the bottom upward over said face to be treated; and in that ultrasound waves are applied to said treatment liquid, which transmits said waves upto said substrate.

Thus, by means of such a method, said unwanted particles are completely taken away from said face to be treated by ultrasound, before being removed by the joint effect of the liquid drag and gravitational attraction. The result thereof is a particularly efficient removal, since, by virtue of the ultrasound, no particle is able to remain sufficiently strongly attached to said face to be treated so as to resist the liquid and gravity.

According to a first embodiment, said sprayed treatment liquid forms a plurality of individual jets, transmitting said ultrasound waves to said substrate. As a variant, said sprayed treatment liquid may form a liquid layer which covers said face to be treated and which transmits ultrasound waves to said substrate.

During said treatment, said substrate could be immobile. However, it is often preferable that it is made to rotate about a vertical axis. Such a rotational movement may be continuous or alternating.

To implement such a method, the present invention in addition relates to a device which is noteworthy in that it comprises:

means for holding said substrate such that said face to be treated is directed downward;

a working surface directed upward and placed under said substrate, facing the latter;

means for spraying the treatment liquid, mechanically connected to said working surface; and at least one ultrasound transducer, mechanically connected to said working surface.

Preferably, said working surface rests on a tank for a heat-conducting liquid and said ultrasound transducer is attached to said tank. Said heat-conducting liquid, which may flow through said tank, thus makes it possible to absorb and remove the heat released by said transducer.

Moreover, it is advantageous that said means for spraying the treatment liquid are in thermal contact with said heat-conducting liquid in the tank. Thus, by heat exchange with the latter, the said sprayed treatment liquid may be brought to a suitable operating temperature. Of course, to this end, it is possible to provide an auxiliary heating source for said liquid in a tank, where the heat supplied by the ultrasound transducer would not be enough for the treatment liquid to reach this operating temperature.

To drain said sprayed treatment liquid after its impact on said face to be treated, it is advantageous to provide a drainage channel at the periphery of said working surface. An annular deflector surrounding said working surface and projecting upward therefrom, intended to direct the spray of said treatment liquid toward said channel may be combined with this channel. A deflector of this sort is particularly advantageous when said substrate rotates during spraying and when the treatment liquid is ejected at the periphery of said substrate. It will be noted that said working surface and said projecting annular deflector form a sort of bowl inside which said substrate may be at least partially placed during spraying. Where, in this bowl, the substrate is relatively far from the working surface, the liquid spray jets remain individual. On the other hand, if the substrate is relatively close to the working surface, said jets may form, by means of the surface tension effect, a liquid layer covering and joining said working surface and said face to be treated of the substrate.

Preferably, said means for holding said substrate are free to move so that they can be moved away from said working surface, for example so that the working surface and said face to be treated of the substrate can be brushed or dried by blowing a gas thereon.

For the same reasons, it is advantageous for said deflector also to be mounted free to move so that it can be moved away from said working surface.

The figures of the appended drawing will give a proper understanding of how the invention can be produced. In these figures, identical references denote similar elements.

Figure 1:
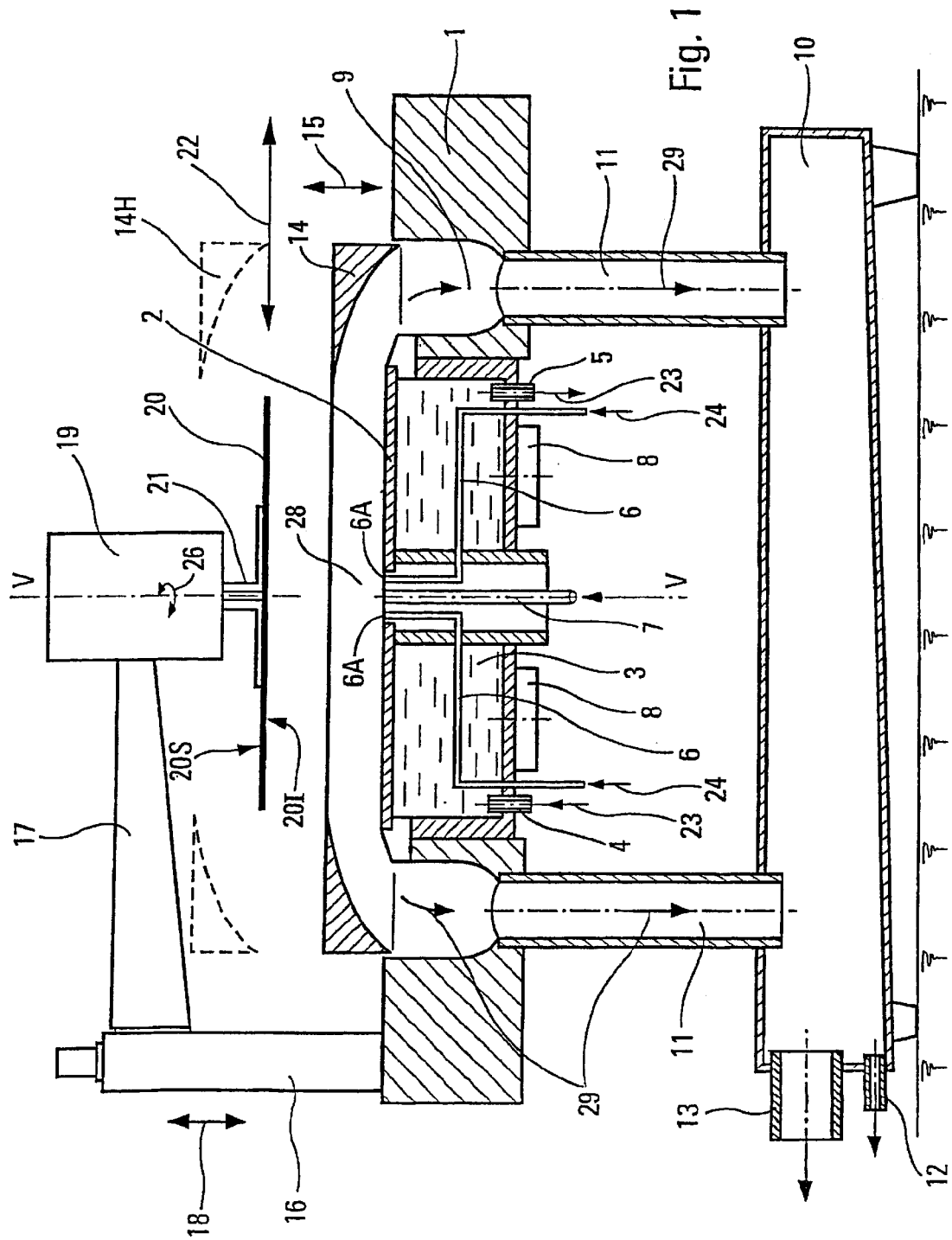
FIG. 1 is a view in schematic elevation, partially in section, of an embodiment of the device according to the present invention.

The device for treating substrates of integrated circuits or of similar products, according to the present invention and shown schematically in FIG. 1, comprises a supporting frame 1 on which a work surface 2 directed upward is arranged. The working surface 2 rests on a tank 3, provided with an inlet 4 and an outlet 5 for a heat-conducting liquid and borne by the supporting frame 1. Pipes 6 pass through said tank 3 so that they are in thermal contact with the liquid flowing therein and they open upward via outlet orifices 6A at the level of said working surface 2. The pipes 6 are fed with treatment liquid for a substrate of integrated circuits in any known manner (not shown). In addition, the supporting frame 1 bears a tube 7 directed upward and fed with a rinsing liquid, for example water. Ultrasound transducers 8 are attached to one wall of the tank 3.

Around the working surface 2, the supporting frame 1 comprises a peripheral channel 9, capable of collecting liquids, in order to carry them into a storage tank 10 placed under said working surface 2, by means of vertical pipes 11. The storage tank 10 comprises an outlet 12 for liquids and an outlet 13 for gasses, generated by said liquids.

An annular deflector 14, capable of deflecting the spray of treatment liquid toward the channel 9, is mounted around the working surface 2 on the supporting frame 1. As indicated schematically by the double arrow 15, the annular deflector 14 can be moved vertically so that it can be moved closer to and away from the supporting frame 1. In FIG. 1, the low position of said deflector is shown in solid line and the high position 14H of said deflector 14 is shown in chain line.

In its low position, the deflector 14 forms, with the working surface 2, a sort of bowl 28 open at the top. Moreover, a vertical column 16 is mounted on the supporting frame 1, said column bearing an overhanging arm 17. Using known means (not shown), the arm 17 may be moved parallel to itself along the column 16, as is symbolized by the double arrow 18.

At its free end, opposite the column 16, the arm 17 bears a device 19 for holding, by suction, an integrated circuit substrate 20. The device 19 holds, via a suction pad 21, the substrate 20 by its upper face 20S, so that the lower face 20I to be treated is directed downward, facing the working surface 2. The suction pad 21 may, in addition, rotate around its vertical axis V.V, such that the substrate 20 may itself rotate about this axis.

When, as is shown in FIG. 1, the arm 17 is in the high position and when the deflector 14 is in the low position, the device of FIG. 1 may be loaded with a substrate 20 by means of a loading and unloading controller, which is not shown but is symbolized by the double arrow 22. After loading, as is shown in FIG. 1, the substrate 20 is centered around the vertical axis V.V and is held by the suction pad 21, such that its face 20I to be treated is directed downward, facing the working surface 2. The substrate 20 may be driven so as to rotate about the vertical axis V—V, either continuously or alternately, as indicated by the double arrow 26.

A temperature control liquid, symbolized by the arrows 23, is made to flow in the tank 3, between the inlet 4 and the outlet 5, and when the ultrasound transducers 8 operate, a treatment liquid, symbolized by the arrows 24, is made to flow in the pipes 6, exchanging heat with the temperature control liquid 23. At the inlet 4 of the tank 3, the temperature of the temperature control liquid 23 is chosen such that, taking into account the supply of heat from the operating transducers 8 and the heat exchange between the liquid 23 and the treatment liquid 24, the latter has the temperature desired at the outlet orifices 6A.

Since the face 20I to be treated of the substrate 20 is brought closer to the working surface 2 and the outlet orifices 6A by lowering the arm 17 (thereby taking the low position 20B1 of FIG. 2 close to the opening of the bowl 28), the latter orifices send jets 25 of liquid 24 (see FIG. 2) to said face 20I to be treated. The ultrasound vibrations generated by the transducers 8 are transmitted to the substrate 20 through the tank 3, the liquid 23, the pipes 6 and the jets 25. Subsequently, the unwanted particles borne by the face 20I of the substrate 20 are detached by said ultrasound waves and removed by the sprayed liquid 24 and by gravity. The liquid 24 sprayed on the face 20I is removed by means of the channel 9 and the pipes 11 thereby taking away said particles (arrows 29).

Figure 2:
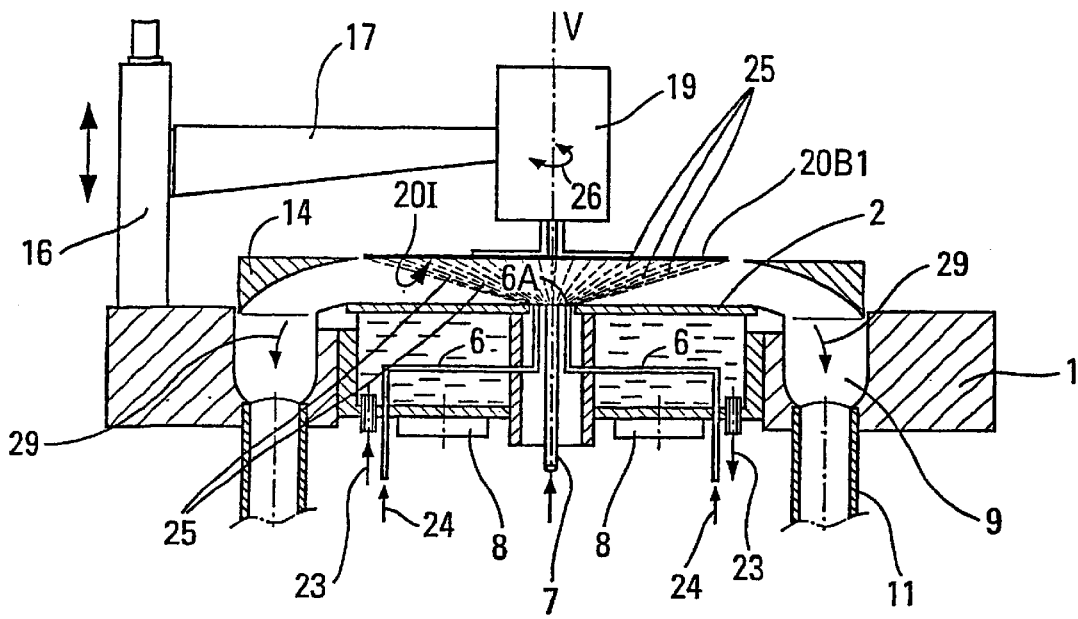
FIG. 2 illustrates schematically, using a partial view of FIG. 1 on a smaller scale, an embodiment of the device according to the present invention.
Figure 3:
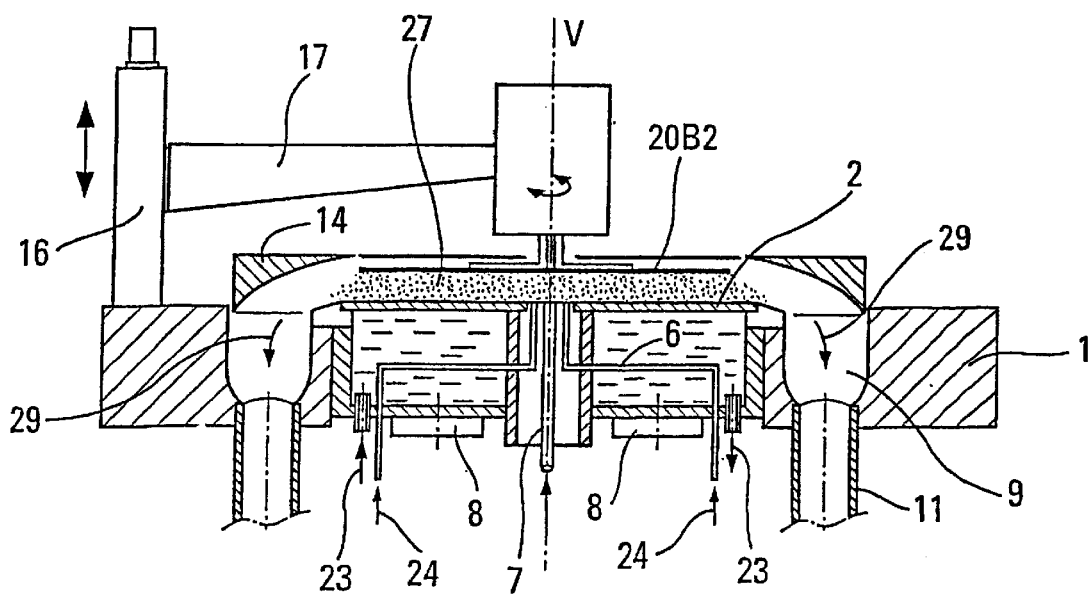
FIG. 3 illustrates schematically, in a view similar to FIG. 2, a variant embodiment of the device according to the present invention.

If the substrate 20 is lowered by the arm 17 so that it takes the low position 20B2 shown in FIG. 3 (in position 20B2, the substrate 20 is introduced into the bowl 28 and is closer to the working surface 2 than in the position 20B1 of FIG. 2), the individual jets 25 may group together into a mobile liquid layer 27, contained between the substrate 20 and the working surface 2 and flowing into the channel 9 and into the pipes 11 (arrows 29).

Of course, in a similar manner to that stated above, the ultrasound waves generated by the transducers 8 are transmitted to the face 20I of the substrate 20 through the layer 27, such that the unwanted particles borne by the face 20I of the substrate 20 are detached and removed therefrom.

It will be easily understood that in the high position of the substrate 20 and of the deflector 14 (position 14H), it is possible to carry out operations of brushing and/or blowing of the working surface 2 and/or of said face 20I.

After spraying with the treatment liquid 24, the face 20I of the substrate 20 may be rinsed using the rinsing liquid sprayed by the tube 7.

What is claimed is:

1. A device for treating a substrate comprising an upper face and a lower face, to remove, by at least a jet of a treatment liquid, unwanted particles borne by said lower face of said substrate, the device comprising:
   means, operable to be releasably applied on said upper face, for holding said upper face of said substrate such that said lower face to be treated is directed downward;
   a working surface operable to be directed upward and placed under said lower face of said substrate, facing said lower face;
   means, mechanically connected to said working surface, for spraying said treatment liquid and directing the at least one jet of treatment liquid upwardly onto said lower face to be treated; and
   at least one ultrasound transducer, mechanically connected to said working surface, that applies ultrasound waves to said treatment liquid for transmission up to said lower face of said substrate.

2. The device as claimed in claim 1, wherein said working surface rests on a tank for a heat-conducting liquid and in that said ultrasound transducer is attached to said tank.

3. The device as claimed in claim 2, wherein said heat-conducting liquid flows through said tank.

4. The device as claimed in claim 2, wherein said means for spraying the treatment liquid are in thermal contact with said heat-conducting liquid.

5. The device as claimed in claim 1, wherein said means for holding the substrate are free to move so that they can be moved away from said working surface.

6. The device as claimed in claim 1, further comprising a drainage channel at the periphery of the working surface.

7. The device as claimed in claim 6, further comprising an annular deflector surrounding said working surface and projecting upward with respect to the latter.

8. The device as claimed in 7, wherein said annular deflector is mounted free to move so that it can be moved away from said working surface.

9. The device as claimed in claim 1, wherein said means for spraying directs upward a plurality of individual jets of said treatment liquid and each of said jets transmits said ultrasound waves to said lower face of said substrate.

10. The device as claimed in claim 1, wherein said treatment liquid covers said lower face with a liquid layer that transmits said ultrasound waves to said lower face of said substrate.

11. The device as claimed in claim 1, further including a device to cause said substrate to rotate about a vertical axis during said treatment.

* * * * *